United States Patent
Chang et al.

[11] Patent Number: 5,949,706
[45] Date of Patent: Sep. 7, 1999

[54] STATIC RANDOM ACCESS MEMORY CELL HAVING A THIN FILM TRANSISTOR (TFT) PASS GATE CONNECTION TO A BIT LINE

[75] Inventors: Ko-Min Chang; Bruce L. Morton; Clinton C. K. Kuo; Keith E. Witek; Kent J. Cooper, all of Austin, Tex.

[73] Assignee: Motorola, Inc., Schaumburg, Ill.

[21] Appl. No.: 09/236,914

[22] Filed: Jan. 26, 1999

Related U.S. Application Data

[62] Division of application No. 08/242,993, May 16, 1994, Pat. No. 5,898,619, which is a continuation of application No. 08/024,026, Mar. 1, 1993.

[51] Int. Cl.[6] .............................. G11C 11/00; H01L 27/11
[52] U.S. Cl. ..................... 365/156; 365/154; 257/369; 257/903
[58] Field of Search ..................... 365/154, 156, 365/149, 190; 257/903, 904, 369, 372

[56] References Cited

U.S. PATENT DOCUMENTS

| | | | |
|---|---|---|---|
| 3,521,242 | 7/1970 | Katz | 340/173 |
| 4,441,169 | 4/1984 | Sasaki et al. | 365/190 |
| 4,633,438 | 12/1986 | Kume et al. | 365/51 |
| 4,779,231 | 10/1988 | Holzapfel et al. | 365/156 |
| 4,910,709 | 3/1990 | Dhong et al. | 365/149 |
| 4,912,749 | 3/1990 | Maruyama et al. | 365/185 |
| 4,995,002 | 2/1991 | Yamada et al. | 365/189.01 |
| 5,040,147 | 8/1991 | Yoshizawa et al. | 365/185 |
| 5,146,429 | 9/1992 | Kawai et al. | 365/200 |
| 5,777,920 | 7/1998 | Ishigaki et al. | 365/154 |
| 5,828,597 | 10/1998 | Madan | 365/156 |
| 5,831,897 | 11/1998 | Hodges | 365/156 |

OTHER PUBLICATIONS

K. Naruke et al., "Stress Induced Leakage Current Limiting to Scale Down EEPROM Tunnel Oxide Thickness", 1988 IEEE, pp. 424–426.

*Primary Examiner*—Son Mai
*Attorney, Agent, or Firm*—Keith E. Witek

[57] ABSTRACT

A memory circuit and method of formation uses a transmission gate (24) as a select gate. The transmission gate (24) contains a transistor (30) which is an N-channel transistor and a transistor (28) which is a P-channel transistor. The transistors (28 and 30) are electrically connected in parallel. The use of the transmission gate (24) as a select gate allows reads and writes to occur to a memory cell storage device (i.e. a capacitor (32), a floating gate (22), etc.) without a significant voltage drop occurring across the transmission gate. In addition, EEPROM technology is more compatible with EPROM/flash technology when using a transmission gate as a select gate within EEPROM devices.

21 Claims, 4 Drawing Sheets

STATIC RANDOM ACCESS MEMORY CELL HAVING A THIN FILM TRANSISTOR (TFT) PASS GATE CONNECTION TO A BIT LINE

Transmitted herewith for filing under 37 C.F.R. §1.53(b) is a Divisional Patent, Application of prior U.S. patent application No. 08/242,993 filed May. 16, 1994, now U.S. Pat. No. 5,898,619 entitled MEMORY CELL HAVING A PLURAL TRANSISTOR TRANSMISSION GATE AND METHOD OF FORMATION which is a continuation of a patent application U.S. Ser. No. 08/024,026 filed Mar. 1, 1993 with the same title, by Ko-Min Chang et al.

FIELD OF THE INVENTION

The present invention relates generally to memory cells, and more particularly, to memory cell circuitry.

BACKGROUND OF THE INVENTION

A memory cell usually contains a storage device and a device for accessing the storage device. The storage device is either one device or a plurality of devices which are used to store at least one binary bit value (i.e. a logic zero or a logic one). For dynamic random access memories (DRAMs), the storage device is a capacitor. For static random access memories (SRAMs), the storage device is a pair of inverters connected in a ring to form a flip-flop. In an electrically erasable programmable read only memory (EEPROM), an electrically programmable read only memory (EPROM), and a flash EEPROM device, the storage device is a floating gate electrode.

For dynamic random access memories (DRAMs), the device for accessing the storage device is typically an N-channel transistor or several transistors in series (i.e. decoder logic and a select gate). For static random access memories (SRAMs), the device for accessing the storage device is a pair of N-channel transistors or two strings of transistors connected in series. One transistor reads/writes the binary bit value to the SRAM cell and the other transistor reads/writes the complement of the binary bit value to the SRAM cell. In each of an electrically erasable programmable read only memory (EEPROM), an electrically programmable read only memory (EPROM), and a flash device, the device for accessing the storage device is a select gate which is usually one of either a P-channel transistor, an N-channel transistor or a plurality of transistors connected in series.

Anytime a transistor or a like device is placed in series with a bit line, a power supply line, a word line, or any conductive interconnect, or a threshold voltage drop across the transistor channel region affects the voltage/current passed through the conductive interconnect. This voltage/current effect may necessitate that higher voltage supplies be used, or may result in a bit line value being difficult to properly write or read.

For example, in an EEPROM, a certain voltage between a source, a drain, and a floating gate is required in order to program and erase the EEPROM properly. A select gate having a voltage drop in series with the floating gate transistor results in a higher select gate voltage being required in order to obtain the correct voltage differences within the EEPROM. In the case of EEPROMs, a power supply voltage of roughly 18 to 22 volts is required due to a transistor select gate and decoding logic voltage drop which is in series with the bit line. For a flash device or an EPROM device, a lesser power supply is required to operate properly. EPROMs and flash devices typically require a power supply voltage within the range of 10 volts to 14 volts.

Given the voltage values above, the integration of EEPROM technology with flash or EPROM devices requires the use of two power supplies. One supply provides roughly 20 volts for the EEPROMs, and the other supply provides roughly 12 volts for the EPROMs/flash devices. Due to the fact that a 20 volt supply voltage is required to support EEPROM usage, an entire integrated circuit (IC) which includes the EEPROM cells must be made more robust to avoid voltage breakdown. The overall process becomes more constrained than necessary for producing functional logic, flash devices, EPROM devices, and other circuits due to the 20 volt supply interconnect and potentials. Device isolation, transistor latch-up, and junction leakage currents become a bigger problem at higher voltages. The multiple power supplies may require that the doping concentrations of integrated circuit well regions and diffusions be different for each device (i.e. EEPROM, flash, EPROM, logic, etc.) in order to optimize device performance. In general, lower voltages are desired for integrated circuit reliability and ease of manufacturing.

SUMMARY OF THE INVENTION

The previously mentioned disadvantages are overcome and other advantages achieved with the present invention. In one form, the present invention comprises a memory cell. The memory cell has a means for storing a binary value. A select gate is coupled to the means for storing a binary value wherein the select gate is further characterized as being a transmission gate.

In another form, the present invention comprises a semiconductor memory circuit. The semiconductor memory circuit has a substrate. A storage device is formed overlying the substrate. A transmission gate is coupled to said storage device to function as a select gate for said storage device.

In yet another form, the present invention comprises a method for forming a semiconductor memory circuit. The method begins by providing a substrate. A storage device is formed overlying the substrate. A transmission gate is formed adjacent said storage device and is coupled to said storage device, said transmission gate functions as a select gate for said storage device.

In general, a transmission gate has a first transistor having a first current electrode and a second current electrode, and a second transistor having a first current electrode and a second current electrode. The first current electrode of the first transistor is coupled to the first current electrode of the second transistor and the second current electrode of the first transistor is coupled to the second current electrode of the second transistor. The first current electrode of the first transistor is also coupled to a storage device. The present invention will be more clearly understood from the detailed description below in conjunction with the accompanying drawings.

DESCRIPTION OF A PREFERRED EMBODIMENT

Figure 1:
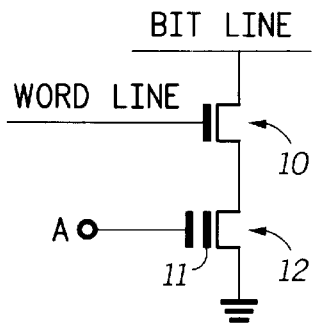
FIG. 1 illustrates in a schematic diagram a conventional electrically programmable read only memory (EPROM) cell.

Illustrated in FIG. 1 is a conventional floating gate memory cell. The cell illustrated in FIG. 1 may be an EPROM, a EEPROM, a flash device, or the like. A transistor 10 functions as a select transistor for the memory cell. Transistor 10 has a gate electrode connected to a word line. The word line may also be referred to as a select line. Transistor 10 has a first current electrode connected to a bit line and a second current electrode. In general, a bit line is a conductor which is used to communicate with a memory cell by performing read, write, program, erase, and/or like operations. When a read or a write operation is to occur to the memory cell, decode logic (not illustrated in FIG. 1) turns on the transistor 10. A transistor 12 has a control gate which receives a voltage labeled "A". A first current electrode of the transistor 12 is connected to the second current electrode of the transistor 10. A second current electrode of the transistor 12 is connected to a ground potential (i.e. a voltage terminal). A ground potential may be any predetermined reference voltage. A floating gate 11 is charged to a positive charge or a negative charge depending upon the voltages applied to the current electrodes and the voltage "A".

To program or erase the memory cell of FIG. 1, the transistor is turned on and a large voltage is applied to the bit line. A predetermined voltage is applied via terminal "A" to the control gate of transistor 12. To erase the memory cell, the voltage applied via terminal "A" is designed so that mobile carriers in the floating gate 11 are tunneled through a gate oxide and carried away from the memory cell through one or more current electrodes. To program the memory cell, the voltage applied via terminal "A" is designed so that mobile carriers in the floating gate 11 are tunneled or hot carrier injected (HCI) through a gate oxide from either the current electrodes into the floating gate 11 or from a channel region into the floating gate 11.

One disadvantage with the memory cell of FIG. 1 is that transistor 10 has a threshold voltage drop or "on" resistance which affects the program and/or erases voltages supplied by the bit line.

In the case of an EEPROM, the transistor 10 has been found in the art to absorb roughly four volts of a voltage potential supplied via the bit line. Therefore, the voltage potential supplied via the bit line must be increased proportionally to overcome the voltage loss across transistor 10 in order to ensure that proper programming and erasing of the memory cell occurs. This increase in voltage potential will increase capacitive cross-talk, increase the occurrence of voltage breakdown across dielectrics, increase the occurrence of a known latch-up phenomenon, reduce device isolation margin, and render EEPROM technology more difficult to integrate with other circuitry and other memory technologies.

Also, EPROM and flash technologies typically require roughly 12 volts supply potentials to operate properly. Therefore if an EEPROM and an EPROM or flash device are formed on the same integrated circuit, one power supply is required for the EPROM/flash and another power supply is required for the EEPROM. The select gate (i.e. transistor 10) illustrated in FIG. 1 is not adequate in all applications even though a small memory cell size is achieved by using a single transistor 10 for a select gate.

Figure 2:
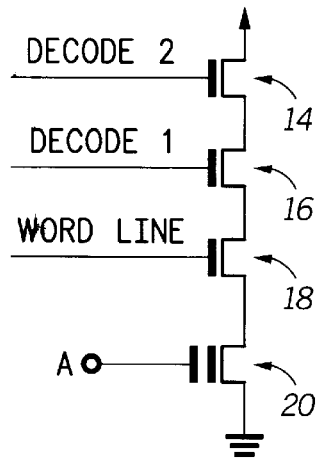
FIG. 2 illustrates in a schematic diagram a conventional electrically programmable read only memory (EPROM) cell including conventional decoding transistors.

In FIG. 2, another conventional floating gate memory cell is illustrated. FIG. 2. has a memory cell formed by transistors 18 and 20 which is similar to the memory cell of FIG. 1. Decode devices or decode transistors 14 and 16 are placed in series with the bit line (i.e. in series with the channel region of transistor 18). The transistors 14 and 16 provide for selective access and decoding of a plurality of floating gate memory cells. For example, transistors 14 and 16 may provide row and/or column decoding. Decoding logic (not illustrated in FIG. 2) is used to generate the signals "decode 1" and "decode 2" which are respectively supplied to a gate of transistor 16 and a gate of transistor 14. Decoding transistors connected in series with a bit line conductor may increase voltage degradation between a storage device and the bit line.

Figure 3:
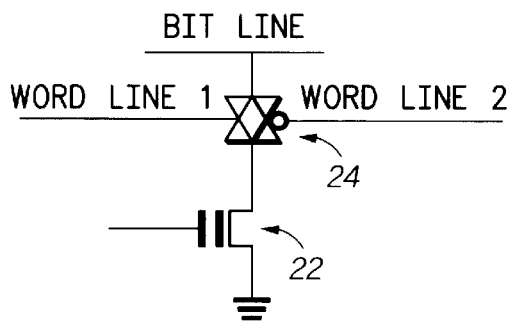
FIG. 3 illustrates in a schematic diagram a floating gate memory cell having a select gate formed from a transmission gate in accordance with the present invention.

FIG. 3 illustrates a floating gate memory device in accordance with the present invention. A transmission gate 24 functions as a select gate for a transistor 22. Transistor 22 has a floating gate and a control gate as illustrated. A first current electrode of transistor 22 is connected to a ground potential. A second current electrode of the transistor 22 connects to a first current electrode of the transmission gate 24. A second current electrode of the transmission gate 24 connects to a bit line. The transmission gate contains two transistors (one N-channel transistor and one P-channel transistor connected in parallel with each other). Due to the fact that two transistors of differing channel conductivity type are used, two word lines are required. A "word line 1" connects to the N-channel transistor and a "word line 2" connect to the P-channel transistor. Typically, word line 1 and word line 2 carry complement signals. In other words, if word line 1 is providing a logic one, then word line 2 is providing a logic zero, and vice-versa.

Transistor 22 functions in a manner similar to transistor 12 of FIG. 1. Transmission gate 24 operates in manner different from the transistor 10 of FIG. 1. Transistor 10 of FIG. 1 affects voltages supplied to and supplied from the bit line due to the fact that the operation of transistor 10 results in a threshold voltage drop. The transmission gate 24 of FIG. 3 does not result in a threshold voltage drop regardless of what voltage potential is supplied to or supplied from the bit line 24.

For example, if twenty-two volts is applied to the bit line of FIG. 1, eighteen volts is the potential of the node which connects transistors 10 and 12. In FIG. 3, if twenty-two volts is applied to the bit line, twenty-two volts is passed to the transistor 22. Therefore, to achieve an eighteen volt potential supplied to the transistor 22, an eighteen volt potential is applied to the bit line of FIG. 3. To supply the same eighteen volt potential to the transistor 12 of FIG. 1, a bit line potential of roughly twenty-two volts is required. Either no voltage drop or a substantially small voltage drop occurs across transmission gate 24 whether the voltage potential on the bit line is negative or positive.

By lowering the voltage potential carried to and from the bit lines and memory cells, capacitive cross-talk is reduced, the occurrence of voltage breakdown across dielectrics is reduced, the occurrence of a known latch-up phenomenon is reduced, opportunity for field inversion is reduced, device isolation is improved, and/or EEPROM technology becomes easier to integrate with EPROM and flash technologies. In addition, the EPROM/flash device and the EEPROM devices may share the same power supply lines (a supply voltage potential within the range of roughly ten to fourteen volts if transistors dimensions are properly designed), which is advantageous.

In order to achieve the above benefits and a simplified process for combining EPROM/EEPROM/flash on a single circuit, the device illustrated in FIG. 3 will most likely increase the cell size of EEPROMs or like floating gate devices which utilize a transmission gate for a select gate. In addition, two word lines are required in FIG. 3 instead of one word line for each memory cell as in FIG. 1. The area increase in the cell and the addition of one word line may not be feasible for high density memory integrated circuits (i.e. 1 Meg byte or larger densities). But the increase in surface area and the additional word lines are not as critical in a microcontroller, a data processor, a microprocessor, a digital signal processor (DSP), and like technologies. In fact, the increased surface area may be tolerated as a necessity in order to achieve EEPROM devices which are integrated with EPROM/flash devices in a simplified complementary metal oxide semiconductor (CMOS) logic device process.

Furthermore, by using silicon on insulator (SOI) technology, thin film transistors (TFTs), epitaxial formations, and/or trench isolation, the surface area of the transmission gate 24 on an integrated circuit may be greatly reduced.

Figure 4:
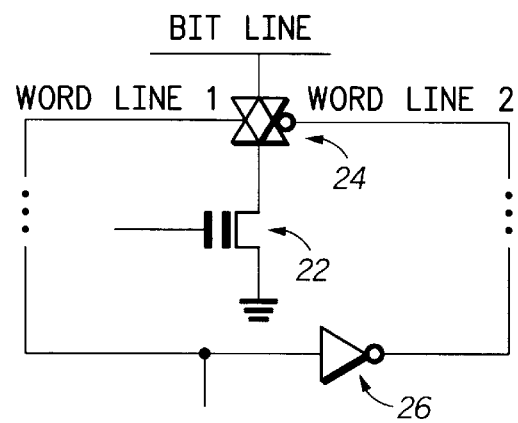
FIG. 4 illustrates in a schematic diagram a floating gate memory cell with word line logic in accordance with the present invention.

FIG. 4 illustrates the memory cell of FIG. 3 wherein an inverter 26 is illustrated. Inverter 26 is used to provide the complement signals for the two word lines of FIG. 3. Inverter 26 provides Vdd voltage levels during read operations, and during program/erase operations the inverter 26 operates at a high voltage level (i.e. greater than Vdd). One inverter 26 may be used for a plurality of memory cells in order to reduce integrated circuit surface area.

Figure 5:
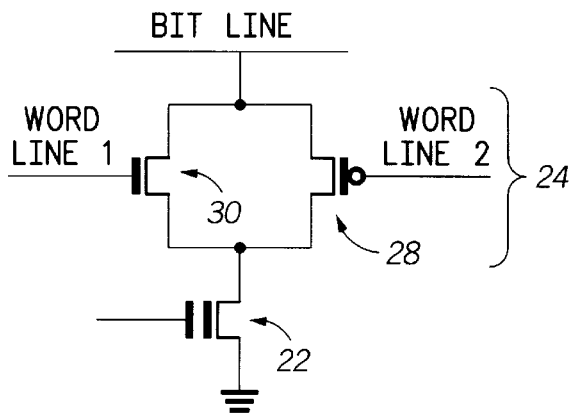
FIG. 5 illustrates in a schematic diagram the floating gate memory cell of FIG. 3 wherein the transmission gate is illustrated in another form which is in accordance with the present invention.

FIG. 5 illustrates the memory cell of FIG. 3 in more detail. The transmission gate 24 of FIG. 3 is illustrated in FIG. 5 in component form. A transmission gate 24 is formed by placing a first transistor 28 in parallel with a second transistor 30. Transistor 28 is a P-channel transistor, and transistor 30 is an N-channel transistor. Transistor 28 has a first current electrode connected to a first current electrode of the transistor 30. Transistor 28 has a second current electrode connected to a second current electrode of the transistor 30. The word line 1 and word line 2 are illustrated as being respectively connected to transistors 30 and 28.

Figure 6:
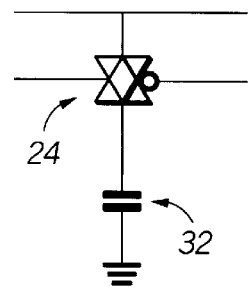
FIG. 6 illustrates in a schematic diagram of a dynamic random access memory (DRAM) cell formed in accordance with the present invention.

FIG. 6 illustrates that other memory cells may use a transmission gate as a select gate. FIG. 6 illustrates a DRAM cell which uses the transmission gate 24 as a select gate. A first electrode of a capacitor 32 is coupled to the transmission gate. A second electrode of the capacitor 32 is connected to a ground potential. The capacitor 32 functions as a storage device for a binary value (i.e. a zero logic value or a one logic value). Note that two word lines are required for the transmission gate 24 of FIG. 6 as illustrated in FIGS. 3–5.

Figure 7:
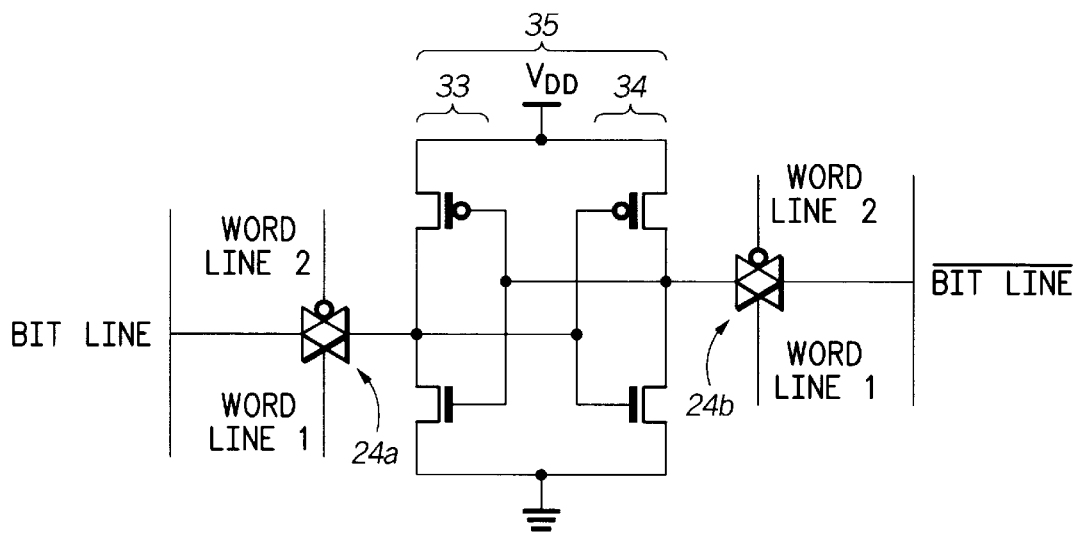
FIG. 7 illustrates in a schematic diagram a static random access memory cell (SRAM) formed in accordance with the present invention.

FIG. 7 illustrates that transmission gates 24a and 24b may be used to form select gates for a static random access memory (SRAM), a random access memory (RAM), a fast SRAM (FSRAM), or the like. A storage device for the memory cell of FIG. 7 is formed via an inverter 33 and an inverter 34. The inverters 33 and 34 are connected in a circular fashion to form a flip-flop 35. The transmission gate 24a is electrically coupled to a node of the inverter 33, and is electrically coupled to a bit line. The transmission gate 24b is electrically coupled to a node of the inverter 34, and is electrically coupled to a complementary bit line. Power supply line Vdd and a ground connection are illustrated in FIG. 7. Note that two word lines are required for the transmission gate 24 of FIG. 6 as illustrated in FIGS. 3–5.

Figure 8:
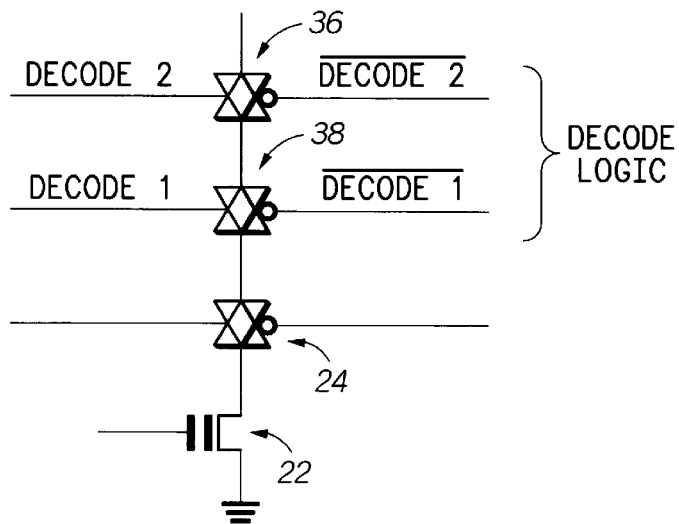
FIG. 8 illustrates in a schematic diagram the floating gate memory cell of FIG. 3 wherein decoder logic is coupled to the floating gate memory cell in accordance with the present invention.

FIG. 8 illustrates that the decoding logic transistors illustrated for the floating gate memory cell of FIG. 2 are replaced by transmission gates 36 and 38. A voltage drop through the bit line due to decoding logic may not be feasible. Therefore, the voltage drop across decoding logic is either eliminated or greatly reduced via the transmission gates 36 and 38. Transmission gates 36 and 38 are connected in series with the select gate (i.e. transmission gate 34).

Many memory devices may be formed having a transmission gate or a plurality of parallel-connected transistors as a select gate given the embodiments taught above. Some of these memory devices include a dynamic random access memory (DRAM), a random access memory (RAM), a static random access memory (SRAM), a fast static random access memory (FSRAM), a read only memory (ROM), an electrically erasable programmable read only memory (EEPROM), an electrically programnmable read only memory (EPROM), a flash EPROM, a flash EEPROM, a charge coupled device (CCD), a nonvolatile memory cell, a flip-flop, and the like.

Figure 9:
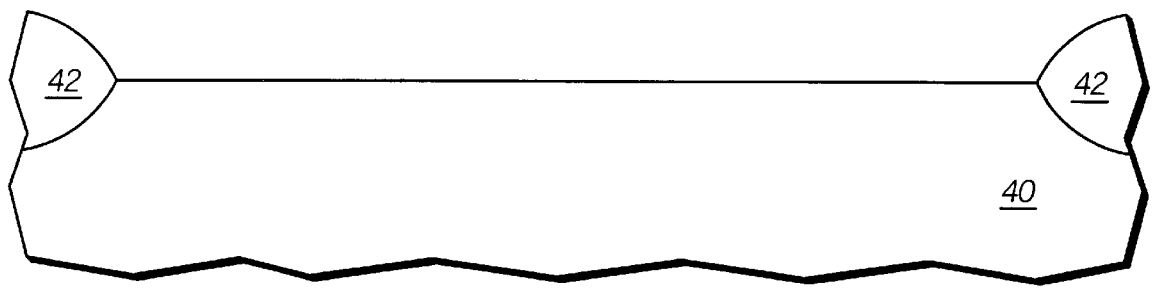
FIGS. 9–13 illustrate, in cross-sectional form, a method for forming a semiconductor memory structure in accordance with the present invention.

In FIG. 9, a substrate 40 is illustrated. Substrate 40 may be made of silicon, gallium arsenide, silicon on sapphire (SOS), epitaxial formations, germanium, germanium silicon, diamond, silicon on insulator (SOI) material, and/or like substrate materials. Preferably, the substrate 40 is made of single-crystalline silicon. The substrate 40 may contain buried layers, diffusions, transistor electrodes, trench regions, wells, and the like. A field dielectric layer 42 is illustrated. Typically, field dielectric layer 42 is a grown silicon dioxide layer. In general, the dielectric layers described herein may be wet or dry silicon dioxide ($SiO_2$), a nitride material, tetraethylorthosilicate (TEOS) based oxides, borophosphosilicate glass (BPSG), phosphate-silicate-glass (PSG), boro-silicate-glass (BSG), oxide-nitride-oxide (ONO), tantalum pentoxide ($Ta_2O_5$), plasma enhanced silicon nitride ($P-SiN_x$), titanium oxide, oxynitride, and/or like dielectric materials. Specific dielectrics are noted herein when a specific dielectric material is preferred or required. Other isolation schemes such as trench isolation, field shield, and the like may be used instead of the field dielectric layer 42.

Figure 10:
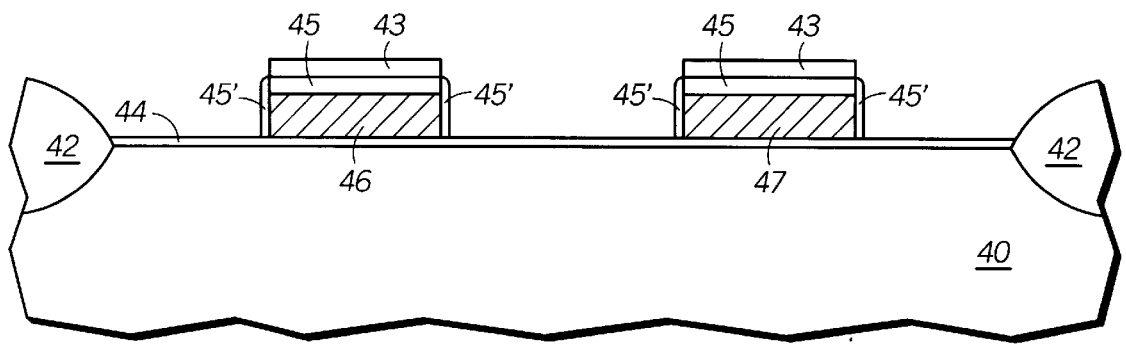

In FIG. 10 a gate oxide layer 44 is formed overlying the substrate 40. A conductive layer (not illustrated), typically made of amorphous silicon and/or polysilicon, is deposited onto the gate oxide layer 44. This conductive layer is subsequently patterned into a floating gate 46 and a gate 47. Gate electrodes may also be referred to as control electrodes. An oxide layer 45 is formed overlying the gate 47 and the floating gate 46. A nitride layer 43 is formed overlying the oxide layer 45. Conventional self-aligned cap oxide or cap nitride processing may be used to form the gate stacks illustrated herein. A sidewall oxidation region 45' is formed to completely isolate the sidewalls of both the floating gate 46 and the gate 47. Typically, the gate 47 and the floating gate 46 are formed having a thickness which is between 1000 Angstroms and 6000 Angstroms. The gate 47 and the floating gate 46 are lithographically patterned to have minimum feature sizes of roughly 0.25 micron to 5.0 micron. Nitride, oxide and dielectric layer thicknesses may vary with process requirements and processing equipment. Dielectrics are typically formed to any thickness down to tens of Angstroms.

Figure 11:
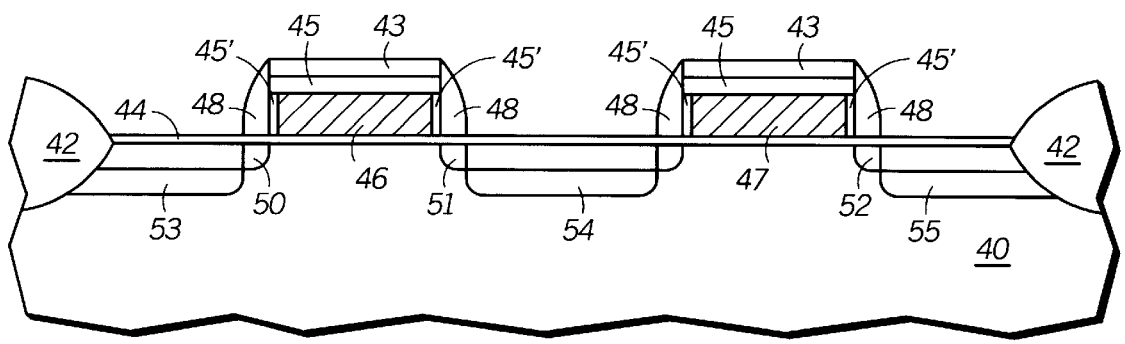

In FIG. 11, lightly doped source and drain (LDD) regions are formed via an ion implant step. Lightly doped regions 50, 51, and 52 are formed by an LDD implant step. The regions 50, 51, and 52 are self-aligned to the gate 47 and the floating gate 46 and the field oxide layer 42. Heavily doped source and drain regions are formed by first forming a nitride spacer 48 laterally adjacent the sidewall oxidation regions 45'. Heavily doped regions 53, 54, and 55 are formed via a heavily doped source and drain implant. Lightly doped drain technology is optional for the process taught herein. It is also important to note that many LDD configurations exist. Any known LDD process may be used to form LDD regions for the transistors of FIG. 11.

Figure 12:
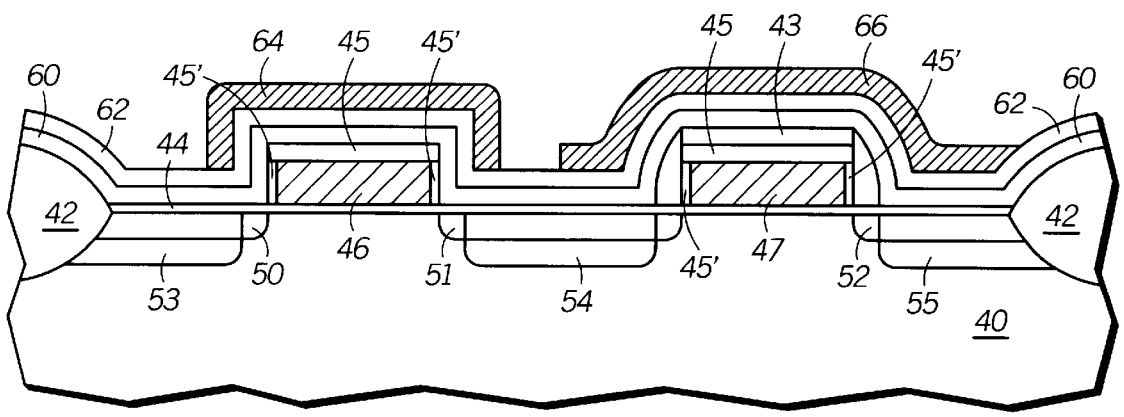

In FIG. 12, a masking layer (not illustrated) is used to mask the regions surrounding gate electrode 47 and expose the regions surrounding floating gate 46. A nitride etch which is selective to oxide is used to remove the layer 43 and the spacer 48 from the regions surrounding the floating gate 46. This mask/etch process is performed to allow capacitive coupling between floating gate 46 and a subsequently-formed overlying control gate. The mask layer (not illustrated) ensures that the layer 43 and the spacer 48 (which is typically formed having a lateral width of 300 Angstroms to 3000 Angstroms) are left adjacent the gate 47 to provide additional isolation between gate 47 and subsequently-formed overlying conductive layers.

In FIG. 12, after the mask/etch process is performed, a nitride layer 60 is formed overlying the gate 47 and the floating gate 46. A dielectric layer 62 which is either deposited or grown is formed overlying the nitride layer 60. A conductive layer is formed and patterned over the dielectric layer 62 to form a control gate 64 and a conductive region 66. The control gate 64 and the conductive region 66 are typically formed via amorphous silicon, polysilicon, germanium silicon, epitaxial silicon, and/or a like layer of material. The control gate 64 and the conductive region 66 may be selectively masked and implanted to form, for example, the control gate 64 as an N+ region and the region 66 as an undoped or P region. The thicknesses of the control gate 64 and the conductive region 66 may be different via by using two different polysilicon layer depositions, or by utilizing selective polysilicon growth techniques. The elements 43, 45, 45', 48, 60, and 62 which lie adjacent the gate 47 in FIG. 12 are all isolation materials. These layers are formed thick enough to ensure that the layer 66 is adequately electrically isolated from the gate 47. Layer 66 may be ion implanted, diffused, or insitu doped to a predetermined conductivity type (i.e. either N-type or P-type). Furthermore, the prior removal of layer 43 and spacer 48 adjacent the floating gate 46 ensures that the control gate 64 may be electrically and selectively coupled to the floating gate 46 and result in tunneling or hot carrier injection (HCI) of charge into or out from the floating gate 46.

In FIG. 12, the elements 45, 45', 60, and 62 form an ONO (oxide-nitride-oxide) layer as an inter-level dielectric between the floating gate 46 and the control gate 64. It should be noted that ONO layers are optional and that any dielectric layer or plurality of dielectric layers may be used to form an inter-level floating gate dielectric.

Figure 13:
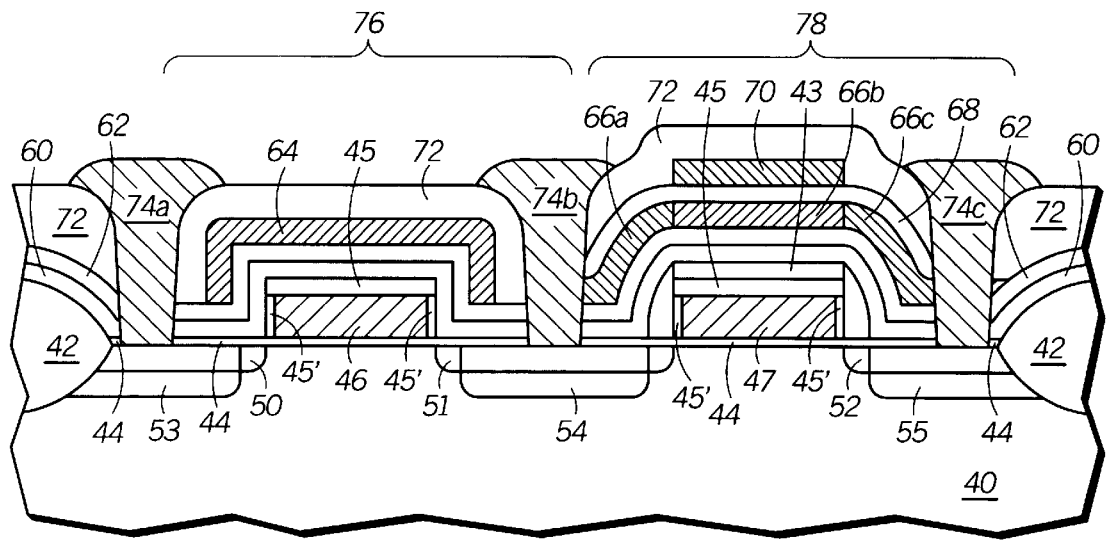

In FIG. 13, a dielectric layer 68 is formed overlying the conductive layer 66 (i.e. regions 66a, 66b, and 66c). The dielectric layer 68 may be grown, deposited, or may contain a plurality of different dielectric layers. Dielectric layer 68 will subsequently function as a gate oxide layer. A gate 70 is formed overlying the dielectric layer 68. Gate 70 may be formed via any conductive layer (i.e. polysilicon, amorphous silicon, a metal layer, a salicided /silicided layer, or the like). A self-aligned ion implant step is used to define regions 66a, 66b and 66c within layer 66. Regions 66a and 66c function as current electrodes (i.e. a source and a drain). Region 66b functions as a channel region wherein gate 70 electrically affects the conductivity of the channel region 66b.

A dielectric layer 72 is formed overlying the control gate 64 and the gate 70. Contact openings are formed through dielectric layer 72 and other layers until a portion of the doped regions 53, 54, and 55 is exposed. Conductive interconnects or conductive plug regions 74a, 74b, and 74c are formed within the openings. Conductive plug regions 74a, 74b, and 74c respectively make electrical contact to the doped regions 53, 54, and 55. The plug regions 74a, 74b, and 74c may be formed of polysilicon, a refractory metal, a silicide or a salicide, and may contain polish stop layers, etch stop layers, barrier layers, and the like as is known in the art. Plug region 74b electrically connects region 66a to region 54. Plug region 74c electrically connects the region 66c to the region 55.

In general, a floating gate cell 76 (i.e. an EEPROM, EPROM, or a flash cell) is formed laterally adjacent a select gate 78. Select gate 78 contains a first transistor and a second transistor. The first transistor has a gate 70, regions 66a, and 66c functioning as current electrodes, and region 66b functioning as a channel region. The first transistor is formed in a manner similar or identical to the formation of known thin film transistors (TFTs) in SRAM cells The second transistor has a gate 47, a channel region within the substrate 40 underlying the gate 47, and current electrodes formed via regions 51, 52, 54, and 55. One of either the first transistor or the second transistor is formed as an N-channel transistor, and the other transistor is formed as a P-channel transistor to form a transmission gate. To ensure that the P-channel and N-channel devices are relatively well matched, epitaxial processing, laser/heat recrystallization, or like processing may be used to ensure that the layer 66 is of a high quality.

Due to the fact that the first transistor and the second transistor are of different conductivity types, PN junctions will result between regions 54 and 66a and regions 55 and 66c. These PN junctions can be electrically short circuited and therefore avoided by either making the regions 74b and 74c from a metallic compound or by siliciding/salicideing the regions 54 and 55 as is known in the art.

The device of FIG. 13 may be compared to the circuit of FIG. 5. The bit line of FIG. 5 is analogous to the regions 74c of FIG. 13. The transistor 30 is analogous to the second transistor of FIG. 13 (i.e. the transistor formed via gate 47). The transistor 28 is analogous to the first transistor of FIG. 13 (i.e. the transistor formed via gate 70). Note that the P-channel and N-channel transistors may be switched in FIG. 13 as a matter of design choice. The transistors 30 and 28 are connected in parallel in FIG. 5. This parallel connection is performed in FIG. 13 by regions 74b and 74c. Word line 1 of FIG. 5 is illustrated in FIG. 13 via gate 47. Word line 2 of FIG. 5 is illustrated in FIG. 13 via the gate 70. The floating gate transistor 22 of FIG. 5 is illustrated in FIG. 13 via the floating gate cell 76. The region 74a of FIG. 13 is connected to ground in a manner analogous to FIG. 5.

In general, FIG. 13 illustrates that a floating gate memory cell having all of the advantages discussed herein may be made in roughly the same substrate surface area currently required by conventional floating gate cells via the use of TFT technology. Conventional CMOS well processing and individual planar transistors may be used to form the circuit illustrated in FIG. 5 although a larger substrate surface area would be required.

It should be apparent, given the methods and devices taught herein, that the select gate 78 of FIG. 13 may be used to form select gates for DRAMs, SRAMs, and other devices as taught herein.

Figure 14:
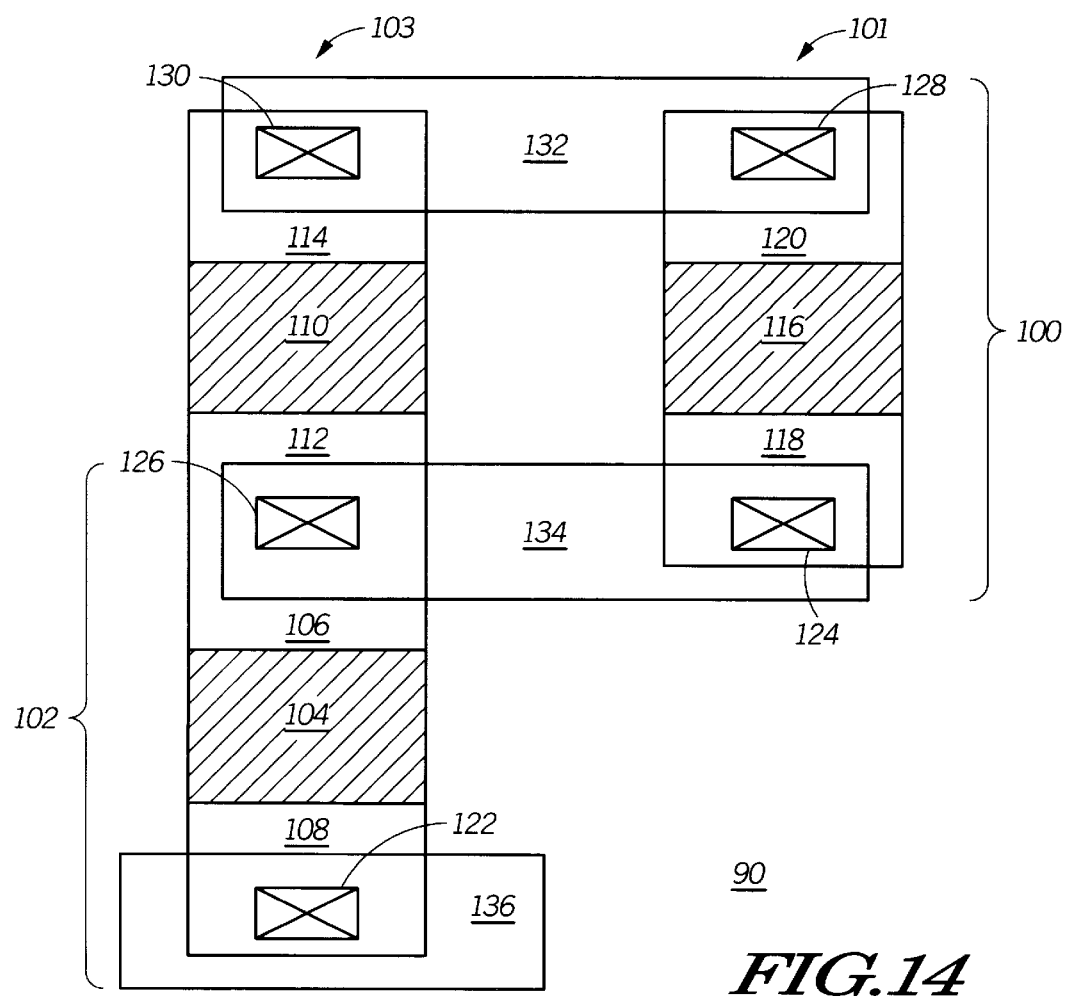
FIG. 14 illustrates in a top perspective view another semiconductor memory structure in accordance with the present invention.

In FIG. 14, a floating gate memory cell is illustrated in a top perspective view as overlying a substrate 90. A transmission gate or select gate 100 is illustrated along with a floating gate device 102. Select gate 100 is formed via an N-channel transistor 103 and a P-channel transistor 101. The N-channel transistor 103 is formed in the well which holds the floating gate device 102 whereas the P-channel transistor 101 is formed in a separate well.

Transistor 101 has a current electrode 120, a current electrode 118, a gate 116, and contact openings 128 and 124. Transistor 103 has a current electrode 114, a current electrode 112, a gate 110, and contact openings 126 and 130. A conductive layer 132 connects current electrode 120 to the current electrode 114 through the contact openings 128 and 130. A conductive layer 134 connects current electrode 118 to the current electrode 112 through the contact openings 126 and 124. The floating gate device 102 has a current electrode 108 and a current electrode 106 which is electrically connected to the current electrode 112. A gate region 104 contains a floating gate and a control gate for the device 102. A conductive layer 136 connects the current electrode 108 to a ground potential via a contact opening 122. The device illustrated in FIG. 14 is analogous to the circuit illustrated in FIG. 5.

It is important to note that the drawings included herein may not be drawn to scale.

While the present invention has been illustrated and described with reference to specific embodiments, further modifications and improvements will occur to those skilled in the art. For example, either under-gated or over-gated TFTs may be used to form the device 78 illustrated in FIG. 13. LDD technology may be used for the TFT devices taught herein. Any memory cell may be formed having a transmission gate containing a plurality of transistors. Self-aligned or non-self-aligned processes may be used to form the floating gate devices taught herein. Storage devices, as described herein may include materials such as ferroelectric materials and ferromagnetic materials. The P-channel and N-channel transistors taught herein are typically MOS enhancement mode devices, although other types of transistors may be used. The methods and devices taught herein may be used to form memory cells within an integrated circuit, a circuit board, or may be used to form a memory cell from discreet components. It is to be understood, therefore, that this invention is not limited to the particular forms illustrated and that it is intended in the appended claims to cover all modifications that do not depart from the spirit and scope of this invention.

We claim:

1. A static random access memory cell comprising:
   a voltage terminal;
   means for storing a binary value coupled to the voltage terminal comprising two cross-coupled inverters;
   a select gate having a first terminal coupled to the means for storing and a second terminal, wherein the select gate is further characterized as being a transmission gate which comprises at least one thin film transistor (TFT) overlying another transistor; and
   a conductor coupled to the second terminal of the select gate to bit line detection circuitry.

2. A static random access memory (SRAM) device comprising:
   a storage device having at least one pull up transistor coupled between a first power supply terminal and a storage node and a pull down transistor coupled between a second power supply terminal and the storage node; and
   a pass device coupled between the storage node and a bit line conductor, the pass device having a first transistor formed in a substrate and coupled between the storage node and the bit line conductor and a second transistor overlying the first transistor and coupled between the storage node and the bit line conductor.

3. The static random access memory (SRAM) device of claim 2 wherein the at least one pull up transistor is at least one P channel transistor and the at least one pull down transistor is a N channel transistor.

4. The static random access memory (SRAM) device of claim 3 wherein the second transistor is a P channel thin film transistor (TFT) transistor overlying the first transistor which is an N channel transistor.

5. The static random access memory (SRAM) device of claim 2 wherein the first power supply terminal is a voltage grater than ground and the second voltage supply terminal is a ground terminal.

6. The static random access memory (SRAM) device of claim 2 wherein the substrate is a semiconductor on insulator (SOI) substrate.

7. The static random access memory (SRAM) device of claim 2 wherein static random access memory (SRAM) device is isolated from other static random access memory (SRAM) devices across the substrate via trench isolation regions.

8. The static random access memory (SRAM) device of claim 2 wherein pull up transistor is a thin film transistor (TFT) overlying the substrate.

9. The static random access memory (SRAM) device of claim 2 wherein first and second transistor are separated by a nitride layer formed over the first transistor.

10. The static random access memory (SRAM) device of claim 9 wherein first and second transistor are also separated by an oxide layer formed over the first transistor.

11. The static random access memory (SRAM) device of claim 9 wherein second transistor is an overgated thin film transistor (TFT) having a silicon-containing channel region.

12. A static random access memory (SRAM) device comprising:
    a first inverter having a first P channel pull up transistor coupled between a power supply terminal and a first storage node and a first N channel pull down transistor coupled between the first storage node and a ground supply terminal, a gate electrode of the first P channel pull up transistor being coupled to a gate electrode of the first N channel pull down transistor to form a first interconnected gate structure;

a second inverter having a second P channel pull up transistor coupled between the power supply terminal and a second storage node and a second N channel pull down transistor coupled between the second storage node and the ground supply terminal, a gate electrode of the second P channel pull up transistor being coupled to a gate electrode of the second N channel pull down transistor to form a second interconnected gate structure;

a first conductive portion coupling the first interconnected gate structure to the second storage node and a second conductive portion coupling the second interconnected gate structure to the first storage node; and a thin film transistor overlying a substrate and coupled between the first storage node and a bit line conductor.

13. The static random access memory (SRAM) device of claim 12 wherein a pass transistor is underlying the thin film transistor and is coupled between the bit line conductor and the first storage node.

14. The static random access memory (SRAM) device of claim 13 wherein the pass transistor is an N channel transistor and the thin film transistor is a P channel transistor.

15. The static random access memory (SRAM) device of claim 13 wherein the pass transistor and the thin film transistor are separated by a nitride layer.

16. The static random access memory (SRAM) device of claim 12 wherein the first and second P channel pull up transistors are thin film transistors that overly the substrate.

17. The static random access memory (SRAM) device of claim 12 wherein the substrate is a silicon in insulator (SOI) substrate.

18. The static random access memory (SRAM) device of claim 12 wherein the static random access memory (SRAM) device is isolated by a trench isolation region.

19. The static random access memory (SRAM) device of claim 12 wherein the thin film transistor overlies a oxide-nitride-oxide (ONO) layer.

20. The static random access memory (SRAM) device of claim 12 wherein the thin film transistor is subject to a recrystallization operation to further crystallize a material used to form a channel region of the thin film transistor.

21. A static random access memory (SRAM) device comprising:

a first inverter having a first P channel TFT pull up transistor coupled between a power supply terminal and a first storage node and a first N channel pull down transistor coupled between the first storage node and a ground supply terminal, a gate electrode of the first P channel TFT pull up transistor being coupled to a gate electrode of the first N channel pull down transistor to form a first interconnected gate structure;

a second inverter having a second P channel TFT pull up transistor coupled between the power supply terminal and a second storage node and a second N channel pull down transistor coupled between the second storage node and the ground supply terminal, a gate electrode of the second P channel TFT pull up transistor being coupled to a gate electrode of the second N channel pull down transistor to form a second interconnected gate structure;

a first conductive portion coupling the first interconnected gate structure to the second storage node and a second conductive portion coupling the second interconnected gate structure to the first storage node;

a pass device having an N channel pass transistor formed in a silicon on insulator substrate and a P channel thin film transistor formed over the N channel pass transistor, the N channel pass transistor being separated from the P channel thin film transistor by a dielectric layer, the N channel pass transistor and the P channel thin film transistor each being coupled between the first storage node and a bit line conductor; and a trench isolation region adjacent the static random access memory (SRAM) device.

* * * * *